(12) United States Patent
Dai et al.

(10) Patent No.: US 11,309,527 B2
(45) Date of Patent: Apr. 19, 2022

(54) DISPLAY PANEL AND DISPLAY APPARATUS

(71) Applicant: WuHan TianMa Micro-Electronics Co., Ltd., Wuhan (CN)

(72) Inventors: Wenpeng Dai, Shanghai (CN); Wei Gao, Shanghai (CN); Lei Zhang, Shanghai (CN); Jinghua Niu, Shanghai (CN); Gaojun Huang, Shanghai (CN)

(73) Assignee: WuHan TianMa Micro-Electronics Co., Ltd., Wuhan (CN)

( * ) Notice: Subject to any disclaimer, the term of this patent is extended or adjusted under 35 U.S.C. 154(b) by 141 days.

(21) Appl. No.: 16/910,382

(22) Filed: Jun. 24, 2020

(65) Prior Publication Data
US 2021/0296621 A1    Sep. 23, 2021

(30) Foreign Application Priority Data
Mar. 19, 2020   (CN) .......................... 202010195217.8

(51) Int. Cl.
*H01L 51/52*    (2006.01)
*H01L 51/00*    (2006.01)

(52) U.S. Cl.
CPC ........ *H01L 51/5284* (2013.01); *H01L 51/004* (2013.01); *H01L 51/5206* (2013.01); *H01L 51/5221* (2013.01)

(58) Field of Classification Search
CPC .............. H01L 51/5284; H01L 51/004; H01L 51/0068; H01L 51/0071
See application file for complete search history.

(56) References Cited

U.S. PATENT DOCUMENTS

2019/0181345 A1\* 6/2019 Hwang ............... H01L 51/5225
2020/0199450 A1\* 6/2020 Mizusaki ........... C09K 19/3066

FOREIGN PATENT DOCUMENTS

| CN | 1917727 A | 2/2007 |
| CN | 104752617 A | 7/2015 |
| CN | 108690045 A | 10/2018 |

\* cited by examiner

*Primary Examiner* — Anthony Ho
(74) *Attorney, Agent, or Firm* — Tarolli, Sundheim, Covell & Tummino LLP

(57) ABSTRACT

Provided are a display panel and a display apparatus. The display panel includes an organic light-emitting device, which includes an anode, a cathode, a light-emitting layer between the anode and the cathode, and a capping layer located on a side of a light-exiting side electrode facing away from the light-emitting layer and containing an ultraviolet absorber for absorbing ultraviolet light. After absorbing the ultraviolet light, a molecular volume of the ultraviolet absorber is reduced. By adding the ultraviolet absorber, the organic material in the organic light-emitting device is protected from being damaged, and the service life of the organic light-emitting device is prolonged. Since the molecular volume of the ultraviolet absorber is reduced after absorbing ultraviolet light, the refractive index of the capping layer is increased, improving the light extraction efficiency and the light-emitting efficiency of the organic light-emitting device, and also prolonging the service life.

17 Claims, 4 Drawing Sheets

DISPLAY PANEL AND DISPLAY APPARATUS

CROSS-REFERENCE TO RELATED DISCLOSURES

The present application claims priority to Chinese Patent Application No. 202010195217.8, filed on Mar. 19, 2020, the content of which is incorporated herein by reference in its entirety.

TECHNICAL FIELD

The present disclosure relates to the field of display technology, in particular to a display panel and a display apparatus including the display panel.

BACKGROUND

Consumers' requirements on display panels continue have been increasing with the continuous development of the display technologies, and various types of display panels, such as liquid crystal display panels, organic light-emitting displays, etc. emerged and advanced rapidly. Accordingly, the display technologies such as 3D display, touch display, curved surface display, ultra-high resolution display, and peep prevention display are constantly emerging in order to meet consumers' demands.

Organic light-emitting display panels are favored by consumers due to their advantages such as light weight, thinness, easy bending, high contrast, and low power consumption. In the display field, the market share thereof becomes increasingly bigger year by year, and they are currently one of the research focuses in the display field. In the organic light-emitting display panel, the organic material in an organic light-emitting device is likely and easily damaged by external ultraviolet light and ultraviolet light generated inside the organic light-emitting device, thereby reducing a service life of the device. In addition, a screen of the display panel may be visually dark under relatively strong outdoor light, and thus it is necessary to turn up a brightness of the screen to improve the display effect.

Therefore, the urgent problems to be solved in the field of organic light-emitting technologies are to avoid decomposition of the organic light-emitting material under ambient light irradiation, to improve a light-emitting efficiency of the organic light-emitting device, and increase a contrast of the display panel under ambient light.

SUMMARY

In view of this, one aspect of the present disclosure provides a display panel including an organic light-emitting device. The organic light-emitting device includes an anode, a cathode disposed opposite to the anode, a light-emitting layer located between the anode and the cathode, and a capping layer located on a side of a light-exiting side electrode facing away from the light-emitting layer, the light-exiting side electrode being the anode or the cathode. The capping layer includes an ultraviolet absorber that absorbs ultraviolet light, and after absorbing the ultraviolet light, a molecular volume of the ultraviolet absorber is reduced.

The present disclosure also provides a display apparatus including the display panel described above.

DESCRIPTION OF EMBODIMENTS

It should be noted that specific details are set forth in the following description in order to explaining the present disclosure. However, the present disclosure can be implemented in many other ways different from those described herein, and those skilled in the art can make similar modifications without departing from the scope of the present disclosure. Therefore, the present disclosure is not limited to specific embodiments disclosed below.

Figure 1:
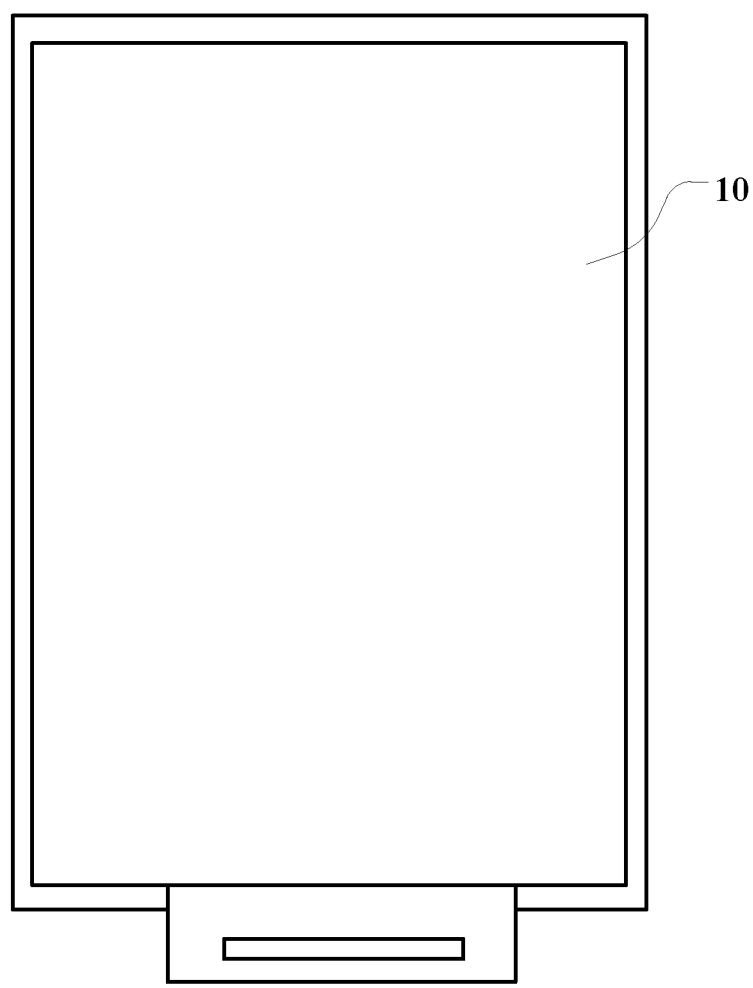
FIG. 1 is a schematic diagram of a display panel provided by the present disclosure.

FIG. 1 is a schematic diagram of a display panel provided by an embodiment of the present disclosure. The display panel 10 includes an organic light-emitting device, and the organic light-emitting device includes an anode, a cathode disposed opposite to the anode, a light-emitting layer located between the anode and the cathode, and a capping layer located on a side of a light-exiting side electrode facing away from the light-emitting layer. The capping layer contains an ultraviolet absorber. In the above-mentioned organic light-emitting device, a molecular volume of the ultraviolet absorber in the capping layer is reduced after absorbing ultraviolet light.

It is found that, after absorption of ultraviolet light, as the molecular volume of the ultraviolet absorber is reduced, a packing density of the ultraviolet absorber in the capping layer increases, and a refractive index of the ultraviolet absorber increases accordingly, which in turn increases a refractive index of the entire capping layer.

In terms of the structure of OLEDs, the current organic light-emitting devices can be classified into top-emission OLEDs and bottom-emission OLEDs, and the light-exiting side electrode can be the cathode or the anode. In the display panel shown in FIG. 1 and FIG. 2, for example, the light-exiting side electrode is the cathode.

In an embodiment of the display panel of the present disclosure, the capping layer is a single-layered capping layer doped with the ultraviolet absorber. In this embodiment, the capping layer can be formed by co-evaporating an ultraviolet light absorbing material and a capping layer (CPL) material.

As the CPL material, those satisfying the performance requirements on refractive index, glass transition temperature, thermal decomposition temperature, etc., can be used, while taking cost of acquisition into consideration. The CPL materials can be selected in a relatively narrow scope. If a uniform mixed layer is manufactured by co-evaporation, an evaporation temperature of the ultraviolet absorber shall not be significantly different from an evaporation temperature of the CPL. In addition, the glass transition temperature, thermal decomposition temperature, and other properties related to ultraviolet light absorption shall be taken into consideration. Therefore, in the present disclosure, the selection of the ultraviolet absorber is substantially limited by the co-evaporation of mixed capping layer.

In another embodiment of the present disclosure, the capping layer includes two capping sub-layers. At least one of the capping sub-layers is doped with the ultraviolet absorber, or at least one ultraviolet absorber layer doped with the ultraviolet absorber is provided between the two capping sub-layers. In this embodiment, the multi-layered capping layer can be obtained by co-evaporating the ultraviolet light absorbing material and the CPL material, so as to form two or more stacked capping sub-layers; or the ultraviolet light absorbing material and the CPL material are alternately evaporated to form two or more stacked capping sub-layers.

The structure of the multiple capping sub-layers has less requirements on the ultraviolet absorber and broadens the selection range of the ultraviolet absorber, and a gradient of the refractive indexes of the ultraviolet absorber and the CPL is possible, so as to improve the light extraction efficiency.

Figure 2:
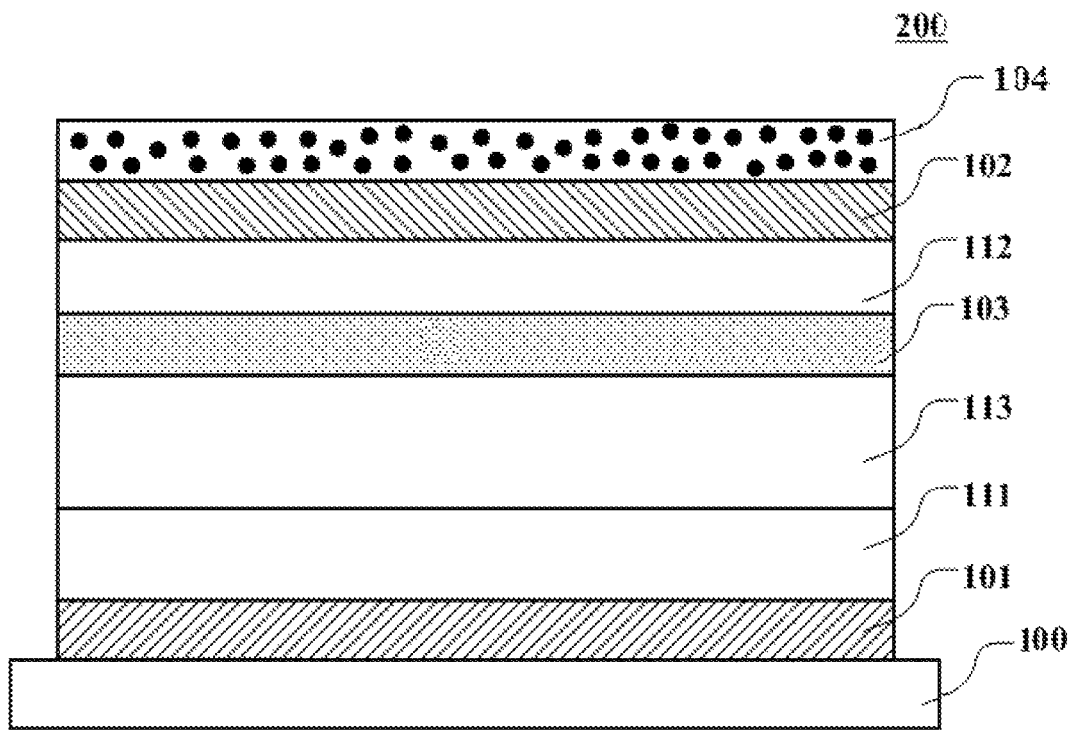
FIG. 2 is a schematic diagram of an organic light-emitting device according to an embodiment of the present disclosure.

FIG. 2 is a schematic diagram of a light-emitting device in a display panel provided by an embodiment of the present disclosure. Referring to FIG. 2, the light-emitting device 200 includes, sequentially disposed on the substrate 100, an anode 101, a cathode 102, a light-emitting layer 103 located between the anode 101 and the cathode 102, a hole injection layer 111 and a hole transmission layer 113 that are located between the light-emitting layer 103 and the anode 101, and an electron transmission layer 112 located between the light-emitting layer 103 and the cathode 102. The light-emitting device 100 further includes a capping layer 104 disposed on a surface of the cathode, and the capping layer contains an ultraviolet absorber, which is illustrated with black dots.

In this embodiment, the light-emitting device 200 is a top-emission device, that is, the anode 101 is a total reflection electrode, the cathode 102 is a translucent electrode, light is emitted from a side of the cathode 102, and the capping layer 104 is disposed on the cathode 102. The capping layer 104 is located on a light-exiting side of the light-emitting layer 103, and the capping layer 104 is doped with the ultraviolet absorber.

In this embodiment, for example, the organic light-emitting device is prepared according to a method including the following steps S11-S24.

S11: the anode 101 is evaporated on the substrate, and the hole injection layer 111 is evaporated on the anode 101, and then the hole transmission layer 113 is evaporated on the hole injection layer 111;

S22: the light-emitting layer 103 is evaporated on the hole transmission layer 113;

S23: the electron transmission layer 112 is evaporated on the light-emitting layer 103, and the cathode 102 is evaporated on the electron transmission layer 112; and S24: the ultraviolet absorber and the capping layer material 104 are co-evaporated on the cathode 102 using an ultraviolet absorber evaporation source and a capping layer material evaporation source, so as to obtain the organic light-emitting device.

In this embodiment, a doping ratio of the ultraviolet absorber in the capping layer can be adjusted to between 5 wt % and 30 wt %. In this way, the absorption rate of ultraviolet light can be ensured, without affecting the light extraction efficiency by an excessive content of the ultraviolet absorber. If the doping ratio is too small (for example, less than 5%), a maximum absorption efficiency of ultraviolet light cannot be achieved; and if the doping ratio is too great (for example, greater than 30%), the light passing through the capping layer will be refracted, causing sharpness increase and deterioration of transparency. Therefore, the doping ratio of the ultraviolet absorber in the capping layer is adjusted to between 5% and 30%.

Instead of the evaporation method, the capping layer containing the ultraviolet absorber can also be prepared by a solvent method. For example, the ultraviolet absorber and the capping layer material are added and mixed with a solvent to prepare a solution or suspension; and then the solution or suspension is sprayed onto the surface of the cathode by inkjet printing to form a thin film layer containing the ultraviolet absorber.

When the mixture inkjet printing is used to prepare the capping layer, it is necessary to match the solubility of the ultraviolet absorber and the solvent. The solvent is preferably capable of simultaneously dissolving the ultraviolet absorber and the capping layer material, so as to form a uniform mixed system of the ultraviolet absorber, the capping layer material and the solvent. Even if the solvent cannot simultaneously dissolve the ultraviolet absorber, it can at least dissolve the capping layer material. Otherwise, serious defects in the capping layer will be caused, which in turn reduces the light-emitting properties of the organic light-emitting device.

Regarding the scheme of doping, the ultraviolet absorber facilitates the arrangement and orientation of other molecules in the capping layer and thus improves the light extraction rate of the capping layer. However, it is necessary for doping the ultraviolet absorber in the capping layer that the ultraviolet absorber has a similar evaporation temperature as other material molecules. Therefore, the scheme is difficult in the matching of molecules, and a relatively complicated process for co-evaporation is required. However, a process involved in a technical solution of the multi-layer capping layer described below is relatively simple.

Figure 3:
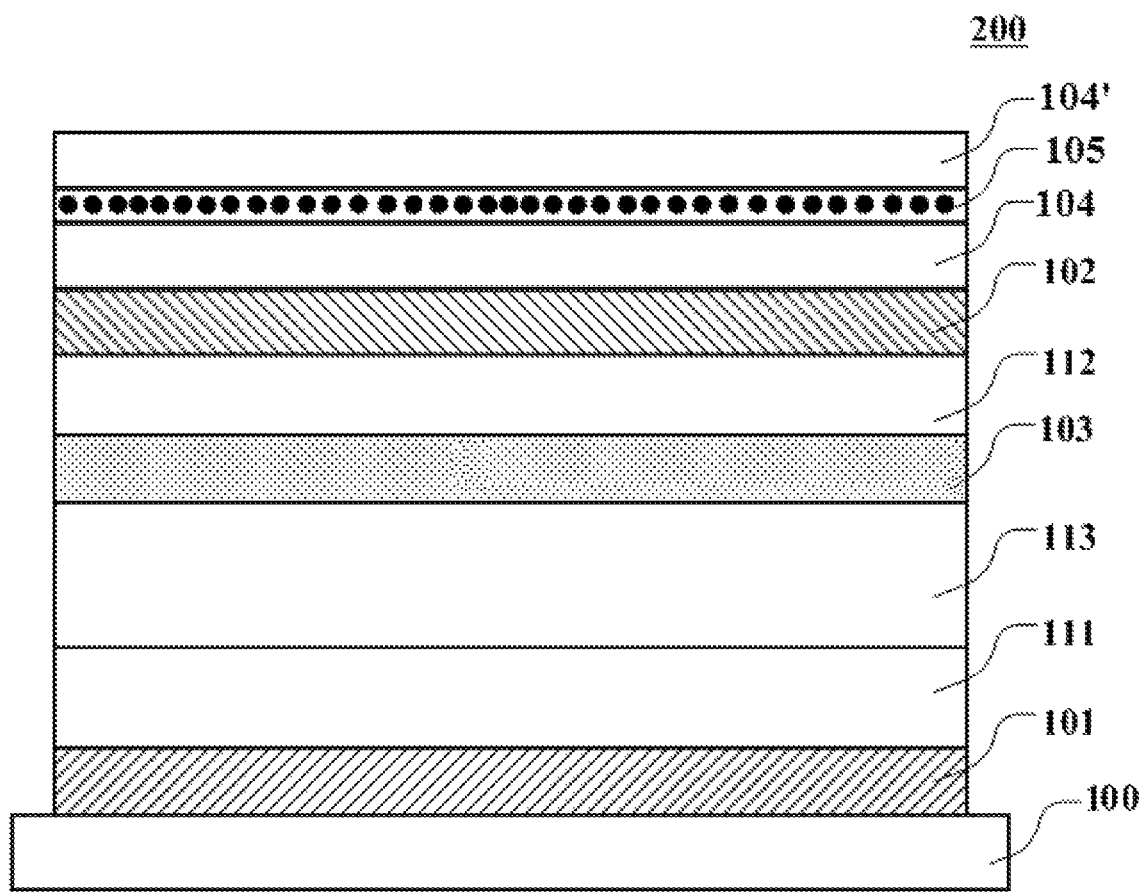
FIG. 3 is a schematic diagram of an organic light-emitting device according to another embodiment of the present disclosure.

FIG. 3 is a schematic diagram of a light-emitting device in a display panel provided by an embodiment of the present disclosure. Referring to FIG. 3, the light-emitting device 200 includes, sequentially disposed on a substrate 100, an anode 101, a cathode 102, a light-emitting layer 103 located between the anode 101 and the cathode 102, a hole injection layer 111 and a hole transmission layer 113 that are located between the light-emitting layer 103 and the anode 101, and an electron transmission layer 112 located between the light-emitting layer 103 and the cathode 102. The light-emitting device 100 further includes a first capping layer 104, an ultraviolet absorber layer, and a second capping layer 104' that are sequentially disposed on a top of the cathode. The ultraviolet absorber in the ultraviolet absorber layer 105 is illustrated with black dots.

In the present embodiment, the light-emitting device 200 is a top-emission device. That is, the anode 101 is a total reflection electrode, the cathode 102 is a translucent electrode, light is emitted from a side of the cathode 102, and the first capping layer 104, the ultraviolet absorber layer 105 and the second capping layer 104' are located on a light-exiting side.

An embodiment of the present disclosure further provides a method for manufacturing the light-emitting device, and the method includes the following steps S21 to S24.

S21: an anode 101 is formed on the substrate, a hole injection layer 111 is formed on the anode 101, and then the hole transmission layer 113 is evaporated on the hole injection layer 111;

S22: the light-emitting layer 103 is evaporated on the hole transmission layer 113;

S23: the electron transmission layer 112 is evaporated on the light-emitting layer 103, and the cathode 102 is evaporated on the electron transmission layer 112; and S24: the first capping layer 104 is evaporated on the cathode 102, the ultraviolet absorber layer 105 is evaporated on the first capping layer 104, and the second capping layer 104' is evaporated on the ultraviolet absorber layer 105, so as to obtain the organic light-emitting device.

In the display panel of the present disclosure, the ultraviolet absorber in the capping layer of the organic light-emitting device may comprises any one of two compounds as a first ultraviolet absorber and a second ultraviolet absorber, as described below.

The first ultraviolet absorber has a molecule with 1,2-diheteroaryl-substituted cyclic olefin group as a first functional group. When the first ultraviolet absorber absorbs ultraviolet light, intramolecular cyclization is likely to occur at the first functional group, and thus the molecular volume of the ultraviolet absorber is reduced.

The second ultraviolet absorber has an azo group. The azo group has a nitrogen-nitrogen double bond (N=N). When the molecules of the second ultraviolet absorber absorb ultraviolet light, groups connected by the azo group undergo a configuration transition at the nitrogen-nitrogen double bond, to convert from an initial trans-configuration to a cis-configuration, which reduces the molecular volume and increases the refractive index.

The two ultraviolet absorbers are specifically described below.

Specifically, the first ultraviolet absorber has a general structure represented by chemical formula 1-1 or chemical formula 1-2:

chemical formula 1-1

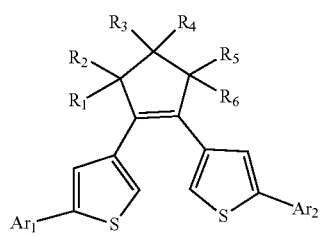

chemical formula 1-2

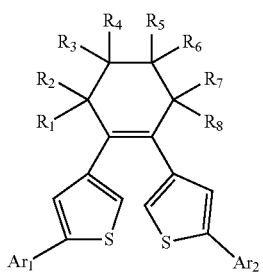

wherein $R_1$-$R_6$ are each independently selected from the group consisting of a hydrogen atom, a fluorine atom, cyano, C1-C10 alkyl, a substituted or unsubstituted C6-C30 aryl, and a substituted or unsubstituted C3-C30 heteroaryl; and $Ar_1$ and $Ar_2$ are each independently selected from the group consisting of groups represented by chemical formula 2-1 and groups represented by chemical formula 2-2:

chemical formula 2-1

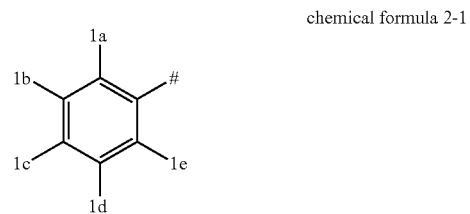

chemical formula 2-2

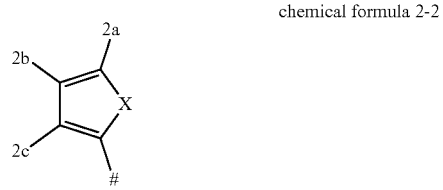

wherein 1a, 1b, 1c, 1d, 1e, 2a, 2b and 2c are each independently selected from the group consisting of a hydrogen atom, quinolyl, isoquinolyl, indolyl, imidazolyl, pyrrolyl, amino, methyl, ethyl, propyl, isopropyl, tert-butyl, methoxy, methylthio, and methylimino; X is N, O, or S, and # indicates a bonding position.

The compound represented by the chemical formula 1-1 is taken as an example to illustrate a molecular structure transition process of 1,2-diheteroaryl-substituted cyclic olefin group after absorbing the ultraviolet light.

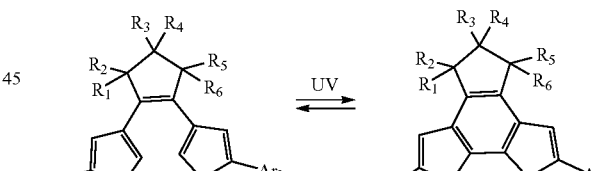

As shown in the above chemical equation, after the ultraviolet absorber absorbs ultraviolet light (UV), cyclization of ethylenic bond occurs, such that the molecule of the ultraviolet absorber changes from an "expanding" state with a larger molecular volume to a "shrinking" state with a smaller molecular volume. In this way, molecular length is shortened, and thus the molecular volume is reduced. The reduction in molecular volume leads to an increase in the refractive index of the compound, thereby increasing the refractive index of the capping layer and improving the light extraction efficiency of the organic light-emitting device. In the absence of ultraviolet light, the molecule returns to the original molecular volume and the original refractive index.

The first ultraviolet absorber, for example, can be any one of the following compounds:

UV11
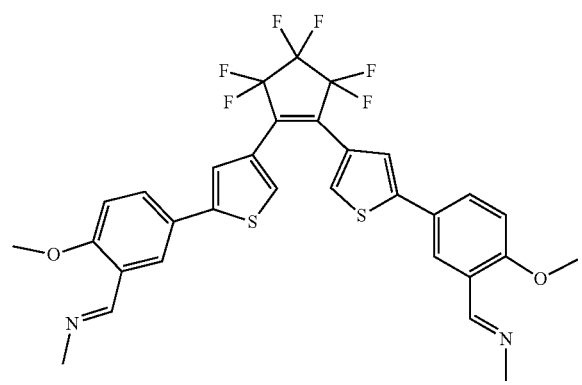
UV14
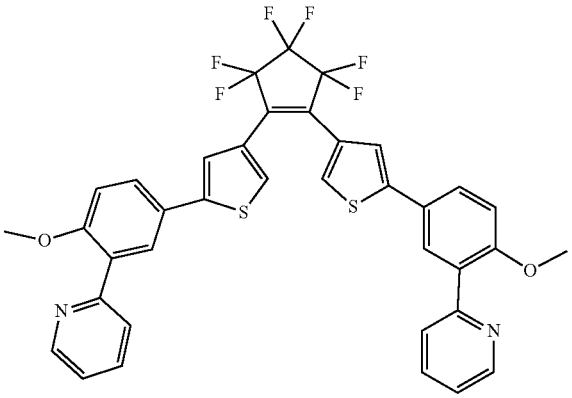
UV12
UV15
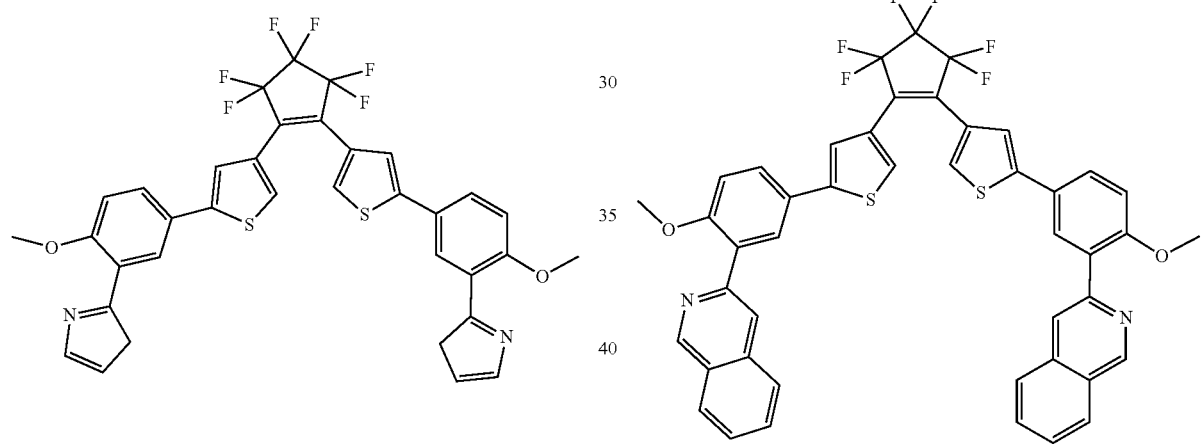
UV13
UV16
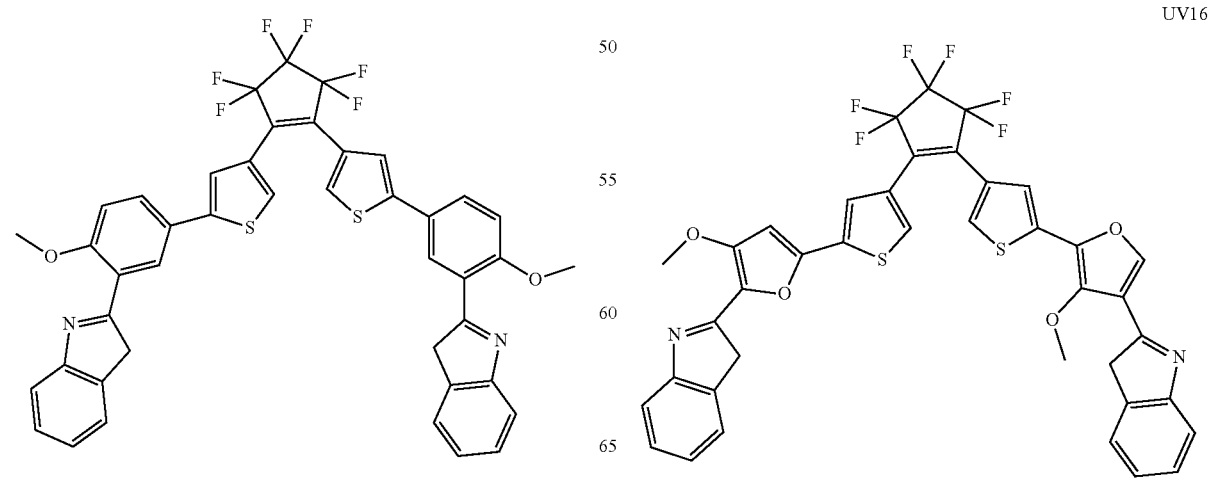

UV17
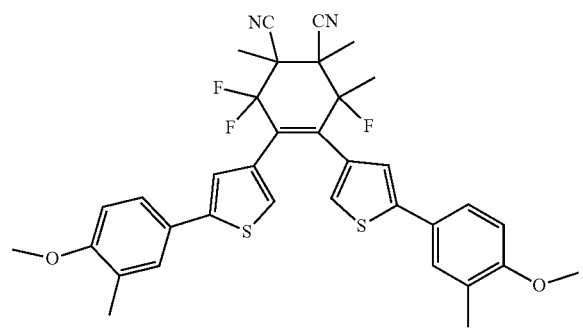
UV20
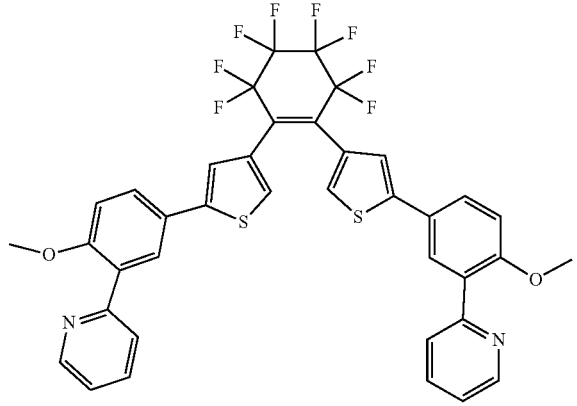
UV18
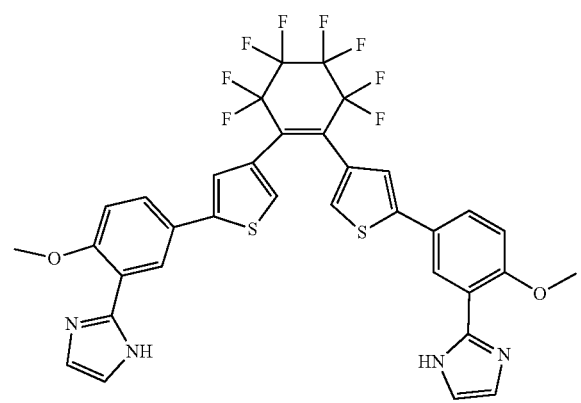
UV21
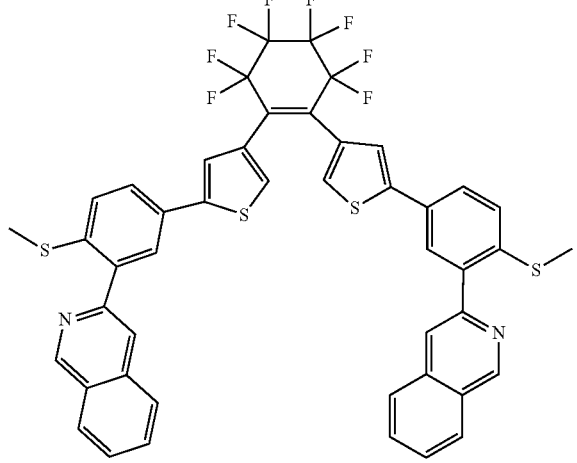
UV19
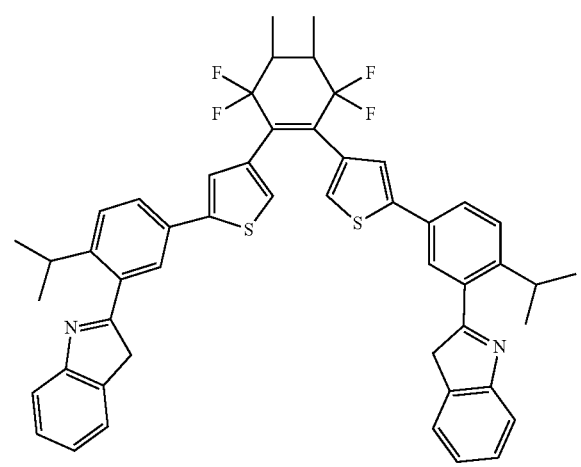
UV22
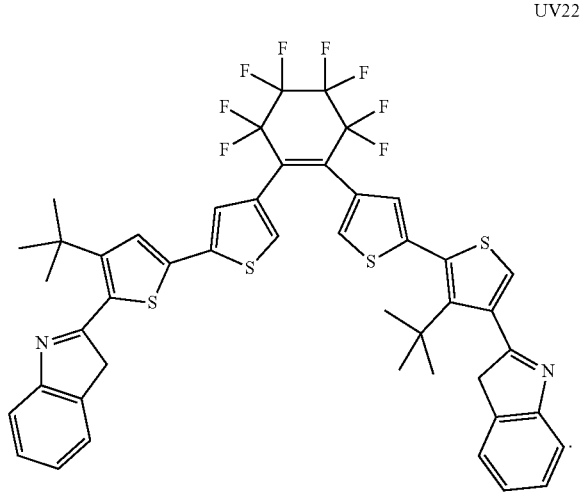

The second ultraviolet absorber has a structure represented by chemical formula 3:

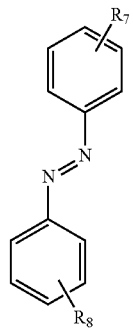

chemical formula 3 wherein R$_7$ and R$_8$ are each independently selected from the group consisting of a hydrogen atom, a fluorine atom, cyano, an alkyl chain, a substituted or unsubstituted C6-C30 aryl, and a substituted or unsubstituted C3-C30 heteroaryl.

When absorbing ultraviolet light, the ultraviolet absorber represented by chemical formula 3 undergoes the following transition:

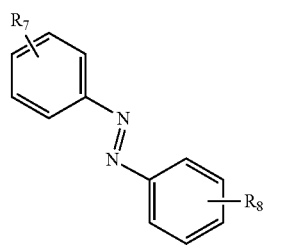 UV 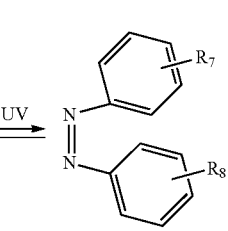

It can be seen that the compound containing azo group as shown in chemical formula 3, after absorbing ultraviolet light, is also converted from an "expanding" state to a "shrinking" state, resulting in a reduction of the molecular volume. The reduction of the molecular volume further results in an increase in the refractive index. Thus, the OLED capping layer adopting such a compound can have an enhanced light extraction efficiency. In the absence of ultraviolet light, the molecules of the compound in the shrinking state can be reversibly converted into the original "expanding" state, which increases the length of the compound molecules, returning to the original molecular volume and the original refractive index.

The second ultraviolet absorber, for example, can be any one of the following compounds:

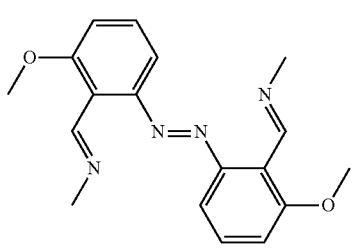

UV31

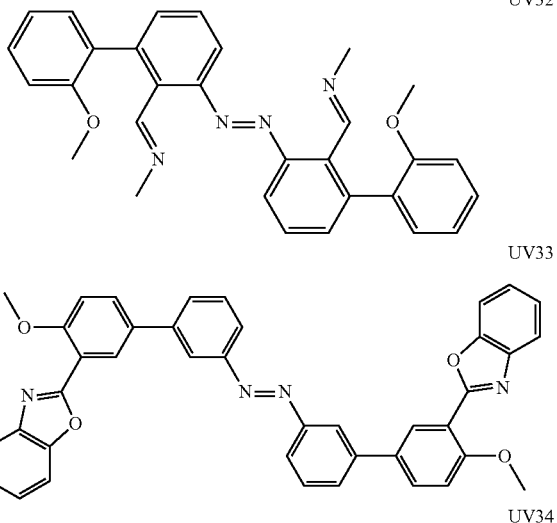

UV32

UV33

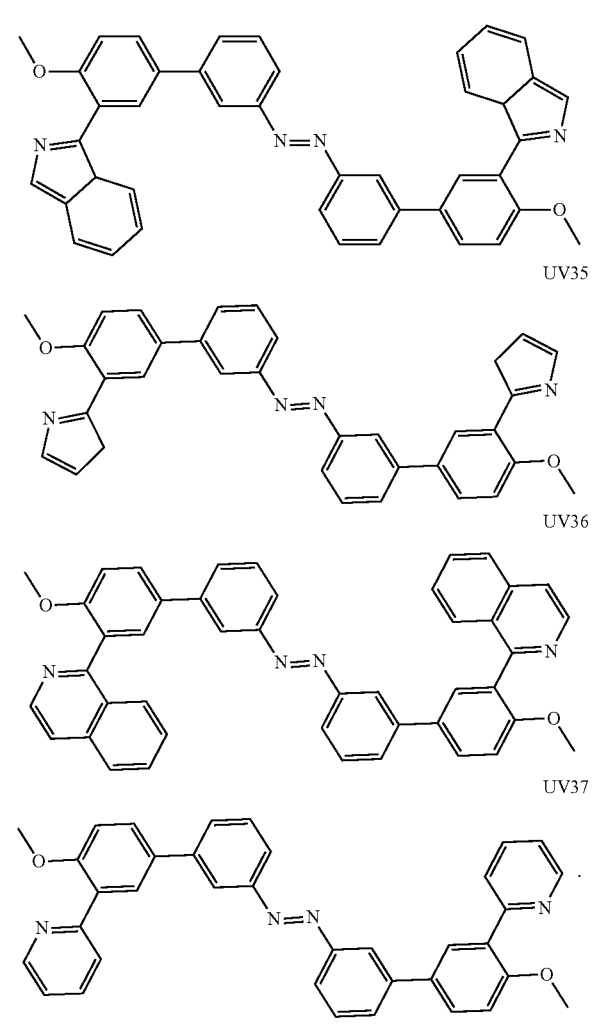

UV34

UV35

UV36

UV37

Instead of the above-mentioned two compounds, other compounds, which has a reduced molecular volume after absorbing ultraviolet light, can also be applied to the capping layer of the organic light-emitting device to increase the refractive index of the capping layer and to improve the light-emitting efficiency of the organic light-emitting device.

The following technical effects can be achieved by adding the ultraviolet absorber to the capping layer.

In an ambient with strong sunlight (e.g., the daytime), when ultraviolet light irradiates on the display panel (e.g. a mobile phone display screen), most parts of the ultraviolet light can be absorbed and shielded by the ultraviolet absorber in the capping layer, so as to protect organic compounds of other organic layers (such as the light-emitting layer, the electron transmission layer, etc.) from being damaged by ultraviolet light. Further, after the ultraviolet absorber absorbs the ultraviolet light, the molecular volume of the ultraviolet absorber is reduced, which results in an increase in the refractive index of the capping layer and thus improves the light extraction efficiency of the organic light-emitting device. In this way, the display panel can have a greater brightness under strong light, i.e., brighter in a front view and darker in a side view. Therefore, it is possible to display normally without adjusting the screen brightness, and it is easier for users to clearly see the contents displayed on the display panel, thereby enhancing the user experience. In addition, as the molecular volume is reduced and the refractive index is increased, it is also possible to enhance the light-emitting efficiency without increasing the voltage or current provided by the battery, such that the solution of the present disclosure can improve the endurance of the electronic device.

In the present disclosure, by adding the ultraviolet absorber whose molecular volume is reduced when exposed to ultraviolet light into the capping layer material of the organic light-emitting device, the problem that the service life of the organic material in the organic light-emitting device is shortened due to ultraviolet radiation can be solved, and the refractive index of the capping layer can be increased when exposed to ultraviolet light, thereby improving the light-emitting efficiency of the organic light-emitting device and bringing good technical effects. Further, in the display panel of the present disclosure, under the condition of weak ultraviolet light or in absence of ultraviolet light, the ultraviolet absorber is able to return to the original molecular volume before absorbing ultraviolet light. It is advantageous in that, when the ultraviolet absorber in the capping layer returns to the original molecular volume under a low level of ultraviolet light (for example, at night) or in absence of ultraviolet light, the refractive index of the capping layer can also return to the original refraction index. In this case, without requiring a higher light-emitting efficiency, the content displayed on the display panel can still be seen clearly, such that human eyes can be protected from being damaged by the strong brightness in a dark environment. In addition, since ultraviolet light is absorbed, other organic materials can be protected from ultraviolet radiation, thereby increasing the service life of the display panel.

As mentioned above, both the first ultraviolet absorber and the second ultraviolet absorber have good chemical and thermal stabilities, significant fatigue resistance and high sensitivity, and also have a designated absorption wavelength. By changing different substituents, the absorption wavelength range thereof can be well controlled.

Applications of the ultraviolet absorbers in display panels and the technical effects thereof are descried below with specific embodiments.

In the present disclosure, the test of the refractive index of the organic light-emitting device to which the ultraviolet absorber is added can be performed according to the following procedure.

A capping layer having a thickness of 40 nm is evaporated on a silicon wafer, then a ultraviolet absorber is coated on the capping layer to form an ultraviolet absorber layer having a thickness of 20 nm, and then another capping layer having a thickness of 40 nm is formed by evaporation, so as to form a sandwich structure. The refractive indexes of the silicon wafer with the ultraviolet absorber layer before and after ultraviolet light irradiation are tested with an ellipsometer. In the case of irradiation with ultraviolet light, ultraviolet light with a wavelength of 440 nm is adopted; and in the case of no irradiation of ultraviolet light, green light with a wavelength of 500 nm is used for irradiation. The test results of the refractive indexes under the ultraviolet irradiation and in absence of ultraviolet irradiation are shown in Table 1 as below.

TABLE 1

Refractive indexes under different irradiation conditions.

| | | Refractive index (n) | |
| --- | --- | --- | --- |
| Embodiment | Ultraviolet absorber | Ultraviolet light irradiation (440 nm) | No ultraviolet light irradiation (500 nm) |
| Embodiment 1 | UV11 | 2.32 | 2.10 |
| Embodiment 2 | UV12 | 2.24 | 2.09 |
| Embodiment 3 | UV13 | 2.28 | 2.07 |
| Embodiment 4 | UV17 | 2.30 | 2.11 |
| Embodiment 5 | UV20 | 2.26 | 2.08 |
| Embodiment 6 | UV22 | 2.30 | 2.12 |
| Embodiment 7 | UV31 | 2.22 | 2.04 |
| Embodiment 8 | UV35 | 2.18 | 2.10 |

It can be seen from Table 1 that the silicon wafer coated with the ultraviolet absorber of the present disclosure exhibits a higher refractive index after absorbing ultraviolet light. This result is consistent with the properties of the ultraviolet absorber. After the ultraviolet absorber of the present disclosure absorbs ultraviolet light, the molecular volume therefore is reduced, and thus capping layer containing the ultraviolet absorber has a greater refractive index.

In practical applications, in order to satisfy the requirements on the brightness and energy consumption of the display panel, both the adsorption rate of the ultraviolet absorber for ultraviolet light and the transmittance to the visible light shall be considered. The light transmittance of the ultraviolet absorber is described as below.

For example, the silicon wafers respectively coated with ultraviolet absorbers UV11, UV12, UV22, UV31 and UV35 were tested in terms of the transmittance of the silicon wafer with the ultraviolet absorber for visible light with a wavelength of 500 nm. The test results are shown in Table 2.

TABLE 2

Test results of transmittances for visible light

| Embodiment No. | Ultraviolet absorber | Transmittance (%) 500 nm |
| --- | --- | --- |
| Embodiment 9 | UV11 | 68 |
| Embodiment 10 | UV12 | 67 |
| Embodiment 11 | UV22 | 65 |
| Embodiment 12 | UV31 | 68 |
| Embodiment 13 | UV35 | 69 |

It can be seen from Table 1 and Table 2 that the absorption rates of the ultraviolet absorbers for ultraviolet light are more than 90%, and the absorption rate of other visible light is less than 30%. In order to reduce the damage of ultraviolet light to the material of the organic layer, the absorption rate, for ultraviolet light, of the ultraviolet absorber in the capping layer is preferably greater than or equal to 90%. At the same time, in order to ensure the light extraction rate, the absorption rate of the ultraviolet absorber for other visible light is preferably less than 30%.

By using the capping layer of the present disclosure, the light-exiting side electrode with the capping layer has a transmittance greater than or equal to 65% for the visible light of 400-700 nm. After the ultraviolet absorber is added to the capping layer of the organic light-emitting device of the present disclosure, the organic light-emitting device still has a high light transmittance for the visible light to ensure the light-emitting efficiency of the entire organic light-emitting device.

By adding the ultraviolet absorber to the capping layer, the organic material in the OLED can be prevented from being irradiated by the ultraviolet light, which postpones an aging of the organic material and prolongs the service life of the organic light-emitting device. The influences of the ultraviolet absorbers on the service life of organic light-emitting devices will be discussed below.

An organic light-emitting device was manufactured according to the following preparation steps:

1) A glass substrate was cut into a size of 50 mm×50 mm×0.7 mm, subjected to ultrasonic treatment respectively in isopropyl alcohol and deionized water for 30 minutes, and then exposed to ozone for about 10 minutes for cleaning, so as to obtain a substrate 200. The substrate 200 was cleaned and then deposited with an indium tin oxide (ITO) anode 101 having a thickness of 15 nm The obtained glass substrate with the ITO anode 101 was mounted on a vacuum deposition apparatus;

2) A hole injection layer material (compound 2) and a p-type doping material (compound 1) were co-deposited by vacuum evaporation on the ITO anode layer 101, in which a doping ratio was 3 wt %, to form a hole injection layer 111 having a thickness of 5 nm;

3) A hole transmission layer material (compound 3) was deposited on the hole injection layer 111 by vacuum evaporation, so as to form a hole transport layer 113 having a thickness of 100 nm;

4) A light-emitting layer 103 having a thickness of 30 nm, in which compound 4 was used as a host material, compound 5 was used as a doping material, and the doping ratio was 3 wt %, was deposited on the hole transmission layer 113 by vacuum evaporation;

5) An electron transport material (compound 6) was deposited on the light-emitting layer 103 by vacuum evaporation to form an electron transport layer 112 having a thickness of 30 nm;

6) A magnesium-silver electrode having a thickness of 10 nm, as the cathode 102, was formed on the electron transmission layer 112 by vacuum evaporation, in which a mass ratio of Mg to Ag was 9:1; and 7) Compound UV11 of the present disclosure was deposited on the cathode 102 by vacuum evaporation to form a capping layer 104 having a thickness of 100 nm.

The compound used in organic light-emitting device can be any one of the following compounds:

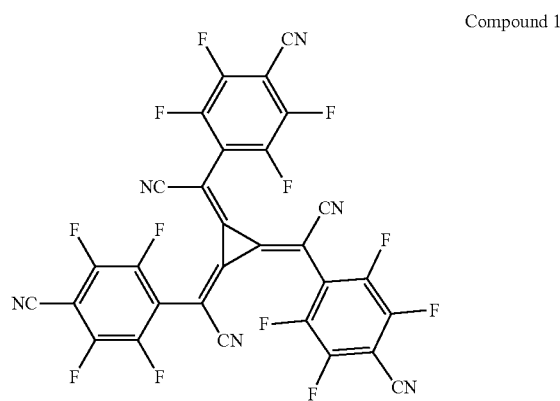

Compound 1

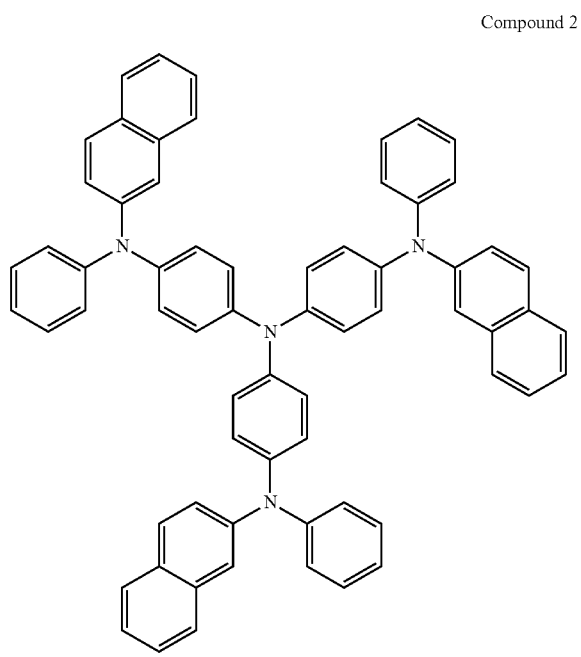

Compound 2

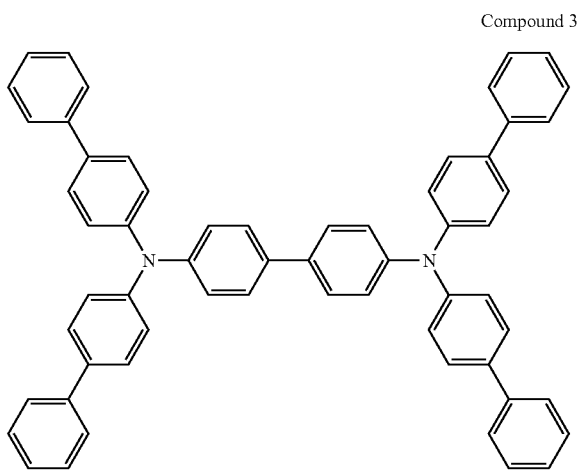

Compound 3

Compound 4

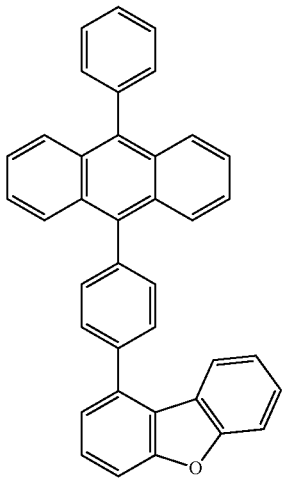

Compound 5

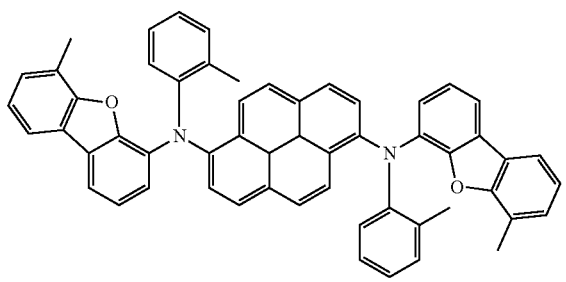

Compound 6

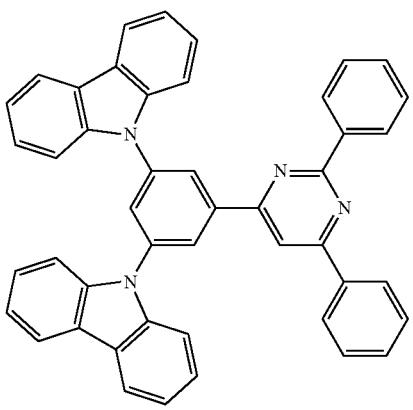

Similarly, organic light-emitting devices were manufactured using UV12, UV13, UV17, UV20, UV22, UV31 and UV35 as materials for the capping layer. The service life of individual manufactured organic light-emitting device was tested. The service life of each of the organic light-emitting devices was represented by LT95. The test results of the service life of organic light-emitting devices including the ultraviolet absorbers are shown in Table 3.

TABLE 3

| | Ultraviolet absorber | | | | | | | | |
| --- | --- | --- | --- | --- | --- | --- | --- | --- | --- |
| | UV11 | UV12 | UV13 | UV17 | UV20 | UV22 | UV31 | UV35 | / |
| LT95 (h) | 72 | 78 | 73 | 69 | 70 | 68 | 63 | 62 | 51 |

Note:
LT95 is a parameter of the service life of an organic light-emitting device, which refers to a time span in which the brightness of the OLED decreases to 95% of an initial brightness; and "/" means that no ultraviolet absorber was added.

It can be seen from Table 3 that the service life of the organic light-emitting device using the ultraviolet absorber is significantly longer than that of the organic light-emitting device without the ultraviolet absorber.

Figure 4:
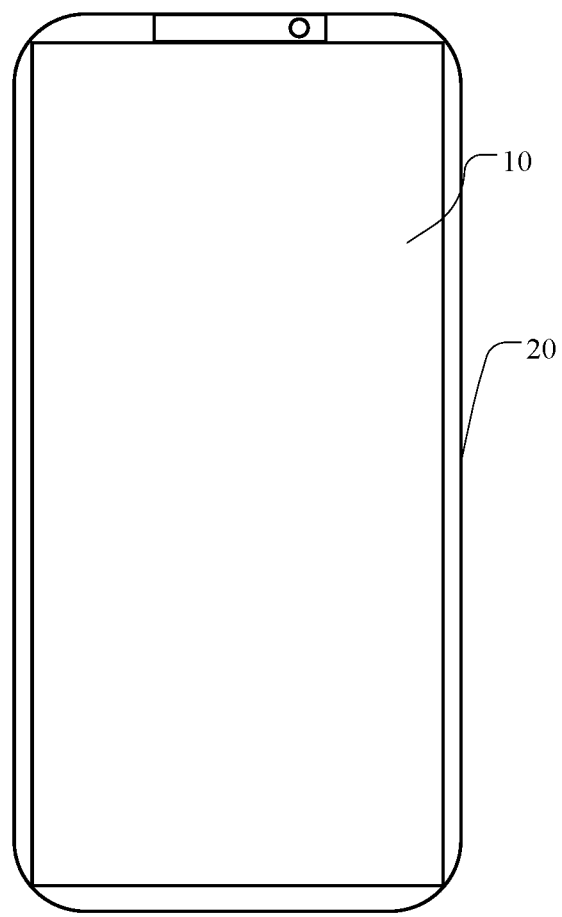
FIG. 4 is a schematic diagram of a display apparatus provided by the present disclosure.

The present disclosure also provides a display apparatus including the organic light-emitting display panel as described above. In the present disclosure, the organic light-emitting device may be an OLED used in an organic light-emitting display apparatus. The organic light-emitting display apparatus may be a display screen of a mobile phone, a computer, a TV, a smart watch, a smart car, VR or AR helmet, or any other various smart device. FIG. 4 is a schematic diagram of a display apparatus according to an embodiment of the present disclosure. In FIG. 4, a display panel of a mobile phone is denoted with reference sign 10, and the display apparatus is denoted with a reference sign 20.

The above are merely the preferred embodiments of the present disclosure, but are not intended to limit the scope of the present disclosure. Those skilled in the art can make various variations and modifications without departing from the concept of the present disclosure. The protection scope of the present disclosure shall be defined by the claims of the present disclosure.

What is claimed is:

1. A display panel, comprising an organic light-emitting device,
wherein the organic light-emitting device comprises an anode, a cathode disposed opposite to the anode, a light-emitting layer located between the anode and the cathode, and a capping layer located on a side of a light-exiting side electrode facing away from the light-emitting layer, the light-exiting side electrode being the anode or the cathode, and
wherein the capping layer comprises an ultraviolet absorber that absorbs ultraviolet light, and after absorbing the ultraviolet light, a molecular volume of the ultraviolet absorber is reduced.

2. The display panel according to claim 1, wherein under a low level of ultraviolet light or in absence of ultraviolet light, the molecular volume of the ultraviolet absorber is restorable to an initial state before absorbing the ultraviolet light.

3. The display panel according to claim 1, wherein a molecule of the ultraviolet absorber comprises a first functional group, and when the ultraviolet absorber absorbs the ultraviolet light, the molecular volume of the ultraviolet absorber is reduced through an intramolecular cyclization of the first functional group.

4. The display panel according to claim 3, wherein the first functional group is a 1,2-diheteroaryl-substituted cyclic olefin group.

5. The display panel according to claim 4, wherein the molecule of the ultraviolet absorber has a structure represented by chemical formula 1-1 or chemical formula 1-2:

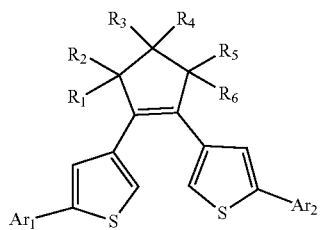

chemical formula 1-1

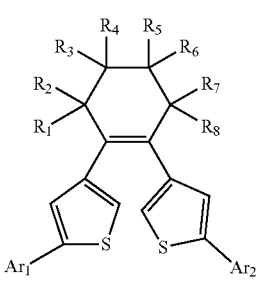

chemical formula 1-2 wherein $R_1$-$R_6$ are each independently selected from the group consisting of a hydrogen atom, a fluorine atom, cyano, C1-C10 alkyl, a substituted or unsubstituted C6-C30 aryl, and a substituted or unsubstituted C3-C30 heteroaryl; and $Ar_1$ and $Ar_2$ are each independently selected from the group consisting of groups represented by chemical formula 2-1 and groups represented by chemical formula 2-2:

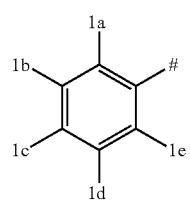

chemical formula 2-1

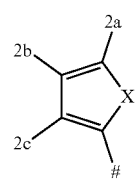

chemical formula 2-2 wherein 1a, 1b, 1c, 1d, 1e, 2a, 2b and 2c are each independently selected from the group consisting of a hydrogen atom, quinolyl, isoquinolyl, indolyl, imidazolyl, pyrrolyl, amino, methyl, ethyl, propyl, isopropyl, tert-butyl, methoxy, methylthio, and methylimino; and X is N, O, or S.

6. The display panel according to claim 1, wherein the ultraviolet absorber is one or more selected from the following compounds:

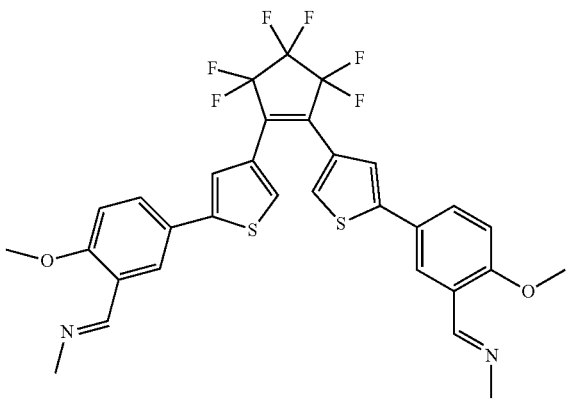

UV11

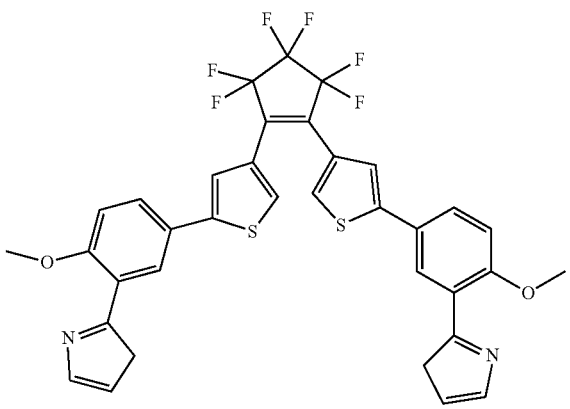

UV12

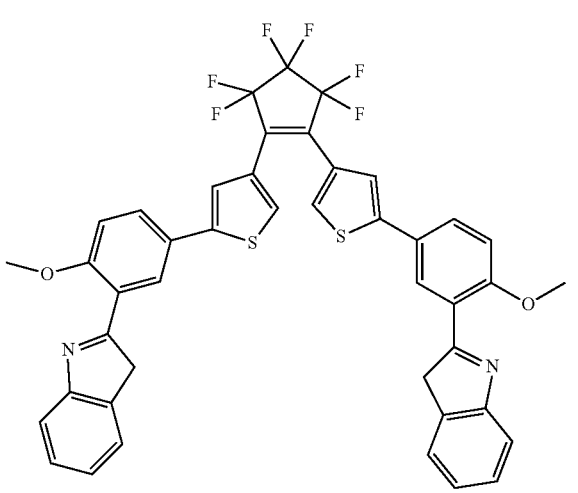

UV13

UV14
UV15
UV16
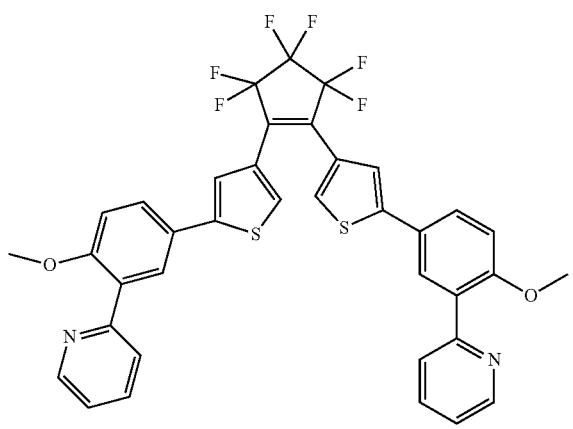
UV17
UV18
UV19
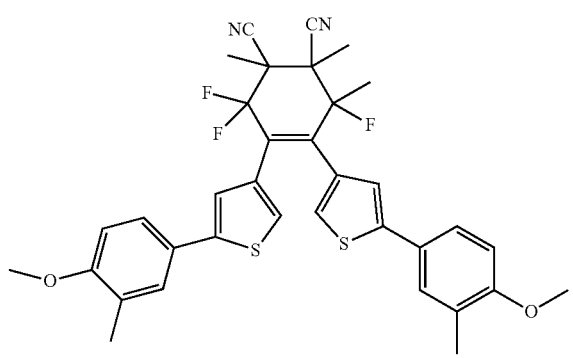
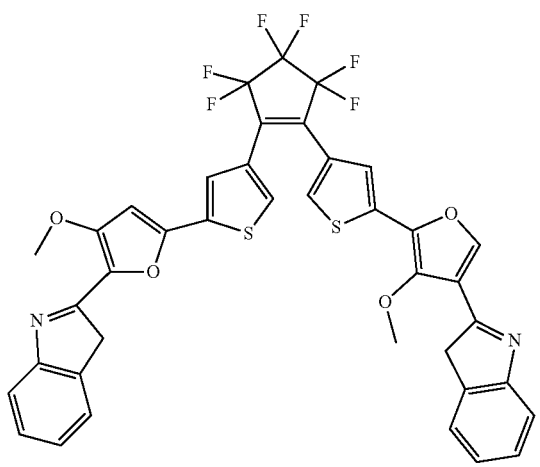

-continued

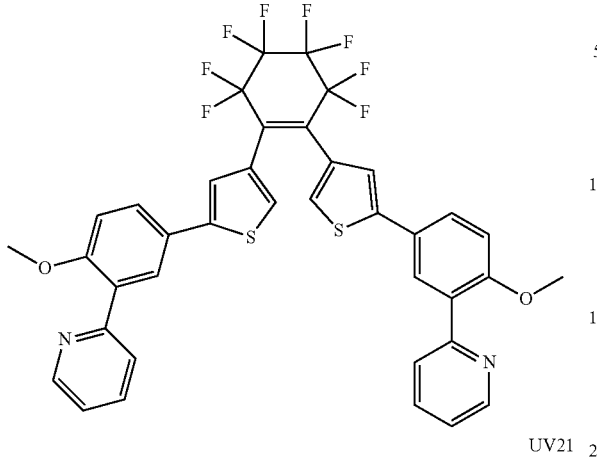

UV20

UV21

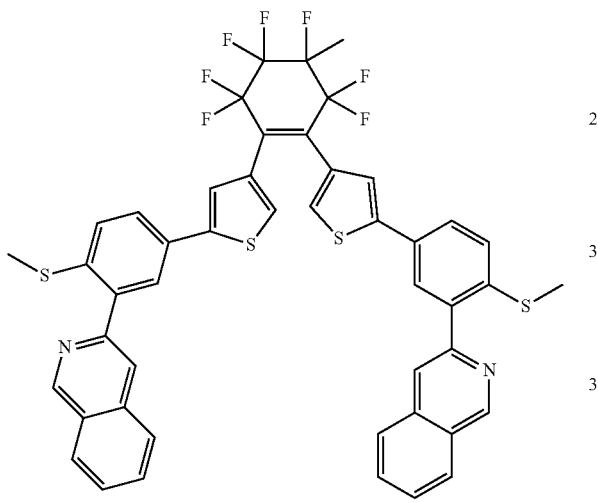

UV22

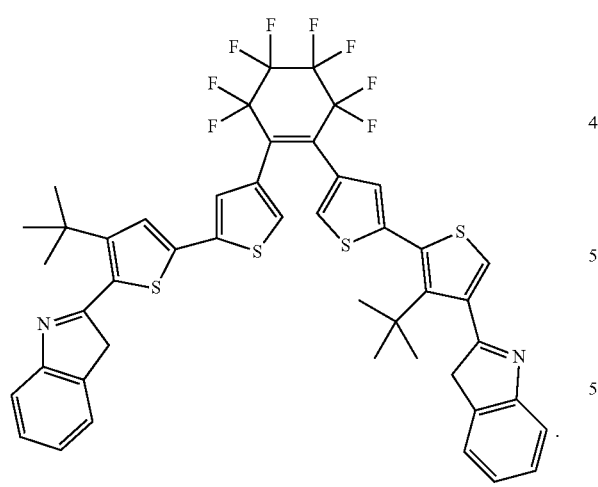

7. The display panel according to claim 1, wherein a molecule of the ultraviolet absorber comprises a second functional group, and when the ultraviolet absorber absorbs the ultraviolet light, the molecular volume of the ultraviolet absorber is reduced through a transition from a trans-configuration to a cis-configuration at the second functional group.

8. The display panel according to claim 7, wherein the second functional group is an azo group.

9. The display panel according to claim 8, wherein the ultraviolet absorber has a structure represented by chemical formula 3:

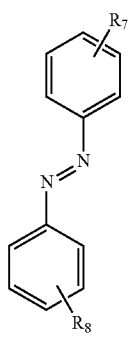

chemical formula 3 wherein $R_7$ and $R_8$ are each independently selected from the group consisting of a hydrogen atom, a fluorine atom, cyano, an alkyl chain, a substituted or unsubstituted C6-C30 aryl, and a substituted or unsubstituted C3-C30 heteroaryl.

10. The display panel according to claim 9, wherein the ultraviolet absorber is one or more selected from the following compounds:

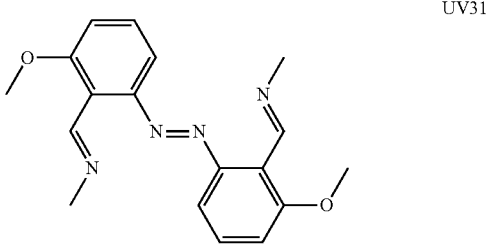

UV31

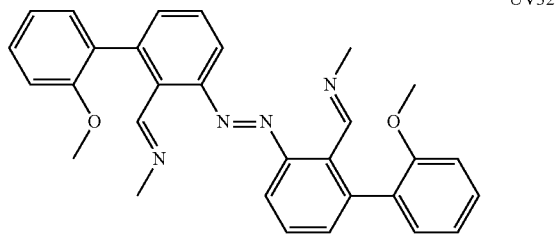

UV32

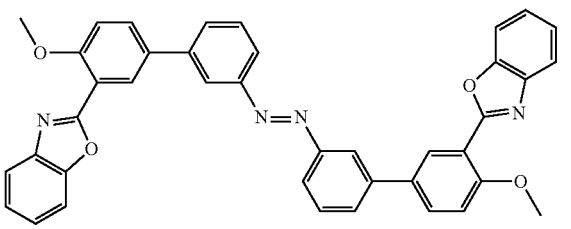

UV33

-continued

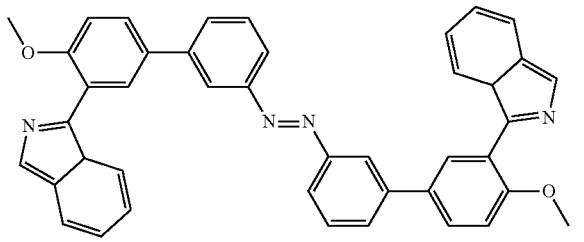

UV34

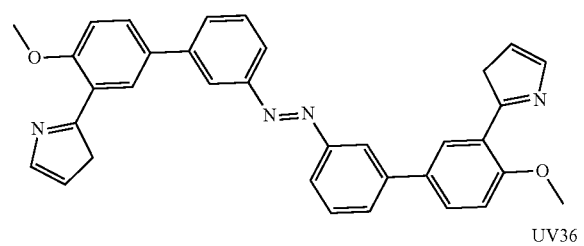

UV35

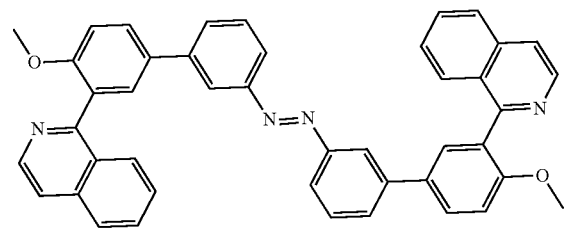

UV36

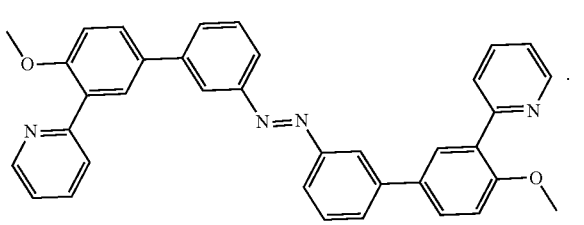

UV37

11. The display panel according to claim 1, wherein the ultraviolet absorber has an absorption rate of the ultraviolet light greater than or equal to 90%, and an absorption rate of other visible light less than 30%.

12. The display panel according to claim 1, wherein a doping ratio of the ultraviolet absorber in the capping layer is 5 wt % to 30 wt %.

13. The display panel of claim 1, wherein the capping layer is a single-layered capping layer doped with the ultraviolet absorber.

14. The display panel according to claim 1, wherein the capping layer comprises at least two capping sub-layers that are stacked, and at least one of the at least two capping sub-layers is doped with the ultraviolet absorber.

15. The display panel according to claim 1, wherein the capping layer comprises at least two capping sub-layers that are stacked, and at least one ultraviolet absorption layer doped with the ultraviolet absorber is disposed between any two adjacent capping sub-layers of the at least two capping sub-layers.

16. The display panel according to claim 1, wherein the light-exiting side electrode and the capping layer together have a light transmittance greater than or equal to 65% for visible light with a wavelength of 400 nm to 700 nm.

17. A display apparatus, comprising a display panel, the display panel comprising an organic light-emitting device, wherein the organic light-emitting device comprises an anode, a cathode disposed opposite to the anode, a light-emitting layer located between the anode and the cathode, and a capping layer located on a side of a light-exiting side electrode facing away from the light-emitting layer, the light-exiting side electrode being the anode or the cathode, and wherein the capping layer comprises an ultraviolet absorber that absorbs ultraviolet light, and after absorbing the ultraviolet light, a molecular volume of the ultraviolet absorber is reduced.

\* \* \* \* \*